(12) United States Patent
Eckberg et al.

(10) Patent No.: US 6,661,670 B1
(45) Date of Patent: Dec. 9, 2003

(54) APPARATUS, ASSEMBLY AND SYSTEM FOR ENHANCING EMI SHIELDING

(75) Inventors: Eric Alan Eckberg, Rochester, MN (US); Michael Scott Good, Fountain, MN (US); David George Lund, Byron, MN (US); Terry Leo Sobotta, Byron, MN (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 10/246,989

(22) Filed: Sep. 19, 2002

(51) Int. Cl.[7] .............................. H05K 5/00; H05K 5/04; H05K 5/06
(52) U.S. Cl. .................. 361/752; 361/753; 361/800; 361/816; 361/818; 361/825; 361/736; 361/737
(58) Field of Search ................. 361/752, 753, 361/800, 816, 818, 825, 736, 737

(56) References Cited

U.S. PATENT DOCUMENTS

| | | | | |
|---|---|---|---|---|
| 5,579,210 A | * | 11/1996 | Ruhland et al. | 361/816 |
| 5,679,923 A | * | 10/1997 | Le | 174/35 R |
| 5,838,550 A | * | 11/1998 | Morris et al. | 361/818 |
| 5,986,892 A | * | 11/1999 | Hargy, III | 361/759 |
| 6,349,043 B1 | * | 2/2002 | Jensen et al. | 361/818 |

\* cited by examiner

*Primary Examiner*—David Martin
*Assistant Examiner*—Thanh Yen Tran
(74) *Attorney, Agent, or Firm*—Leslie J. Payne

(57) ABSTRACT

An assembly for use in providing EMI shielding for a circuit card. The assembly comprises a circuit card; a fastener; and, a shielding apparatus. The shielding apparatus comprises: a body providing EMI shielding and includes an attaching portion extending therefrom, wherein the attaching portion has a segment at a proximal end portion thereof which blocks an opening in the body for controlling EMI leakage and positions the attaching portion so that a fastener can fasten the attaching portion to a circuit card such that a first fastener end portion is engageable in juxtaposed relationship with a first card surface and a second fastener end portion terminates so as not to extend generally beyond a predetermined distance from a second card surface of the card.

15 Claims, 4 Drawing Sheets

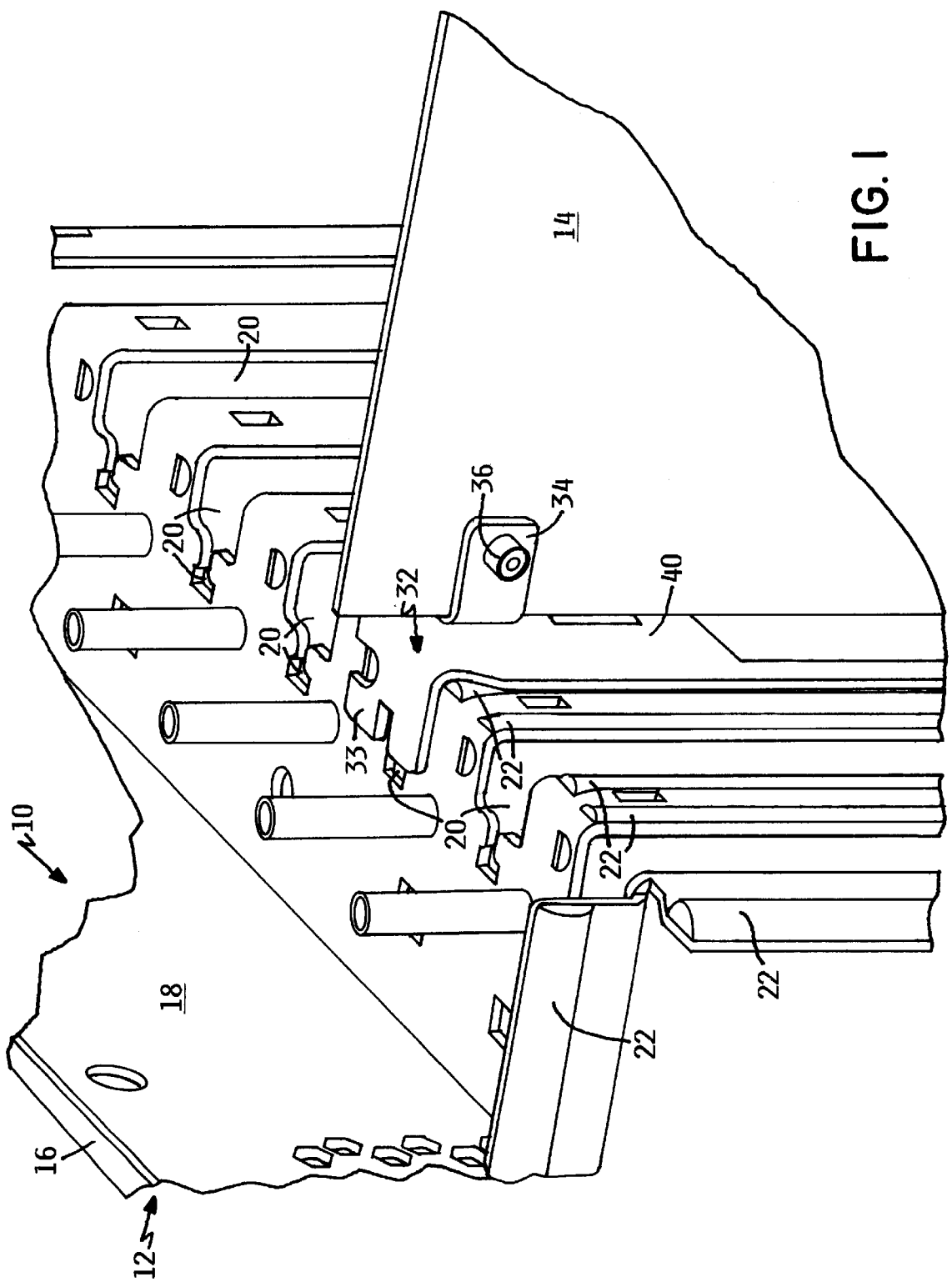

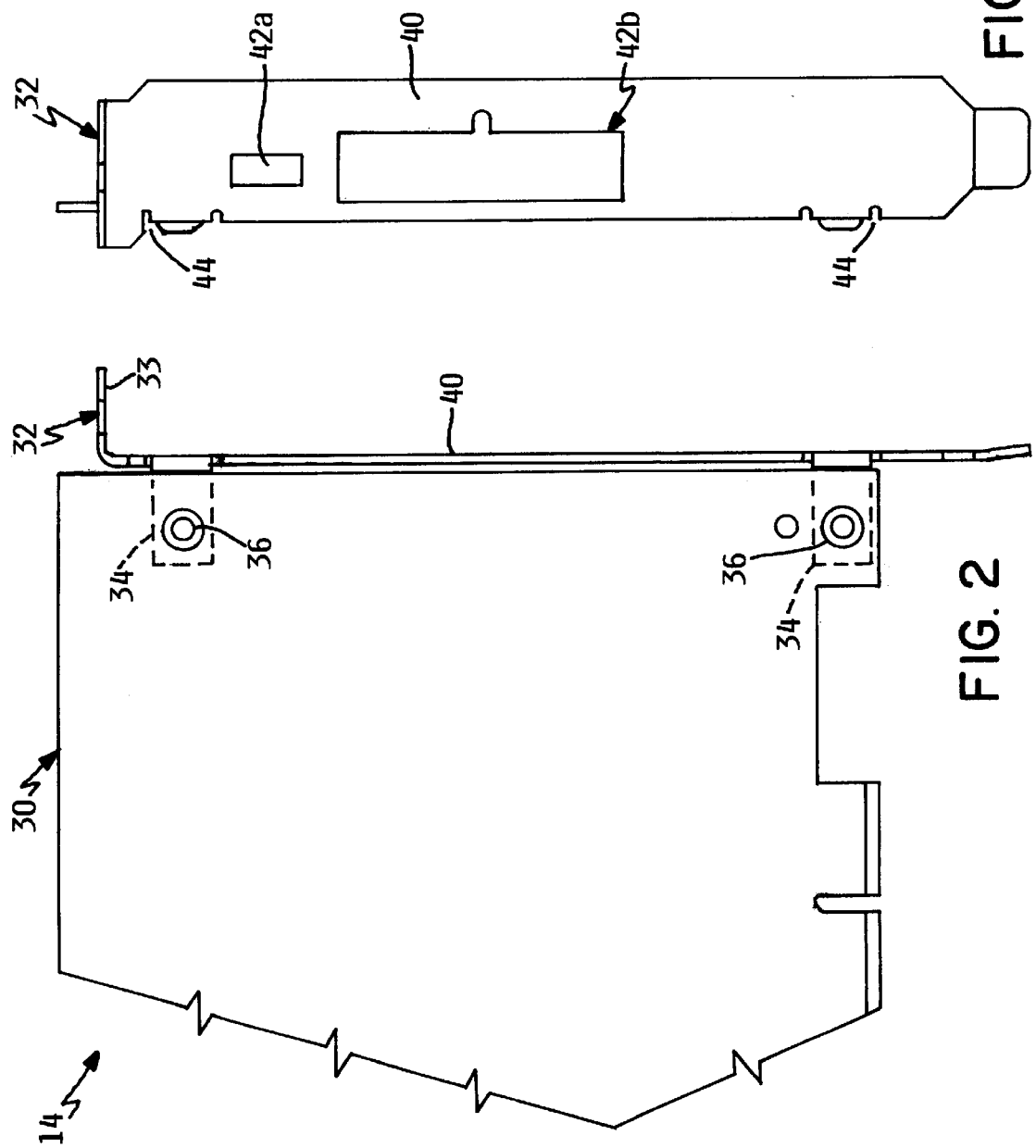

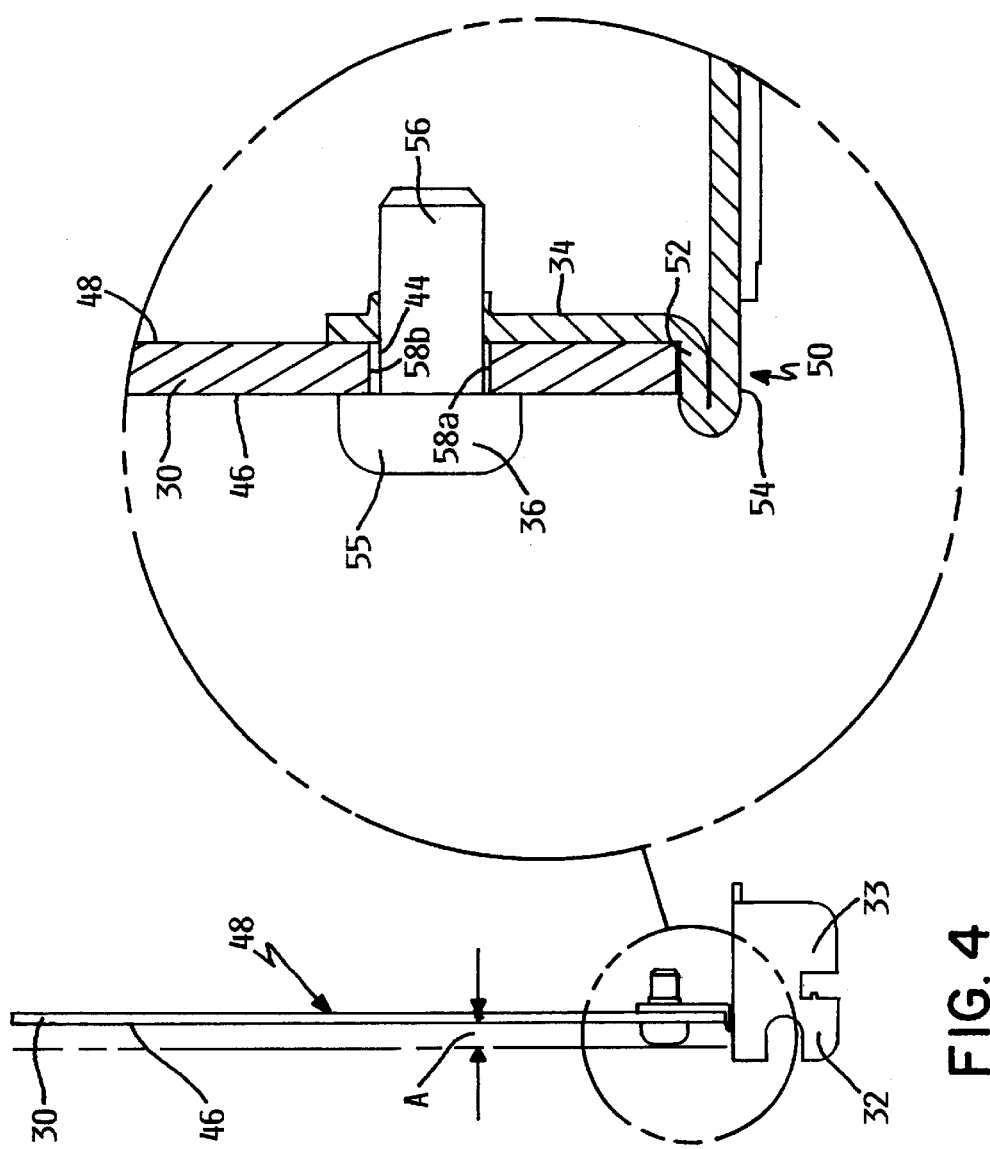

APPARATUS, ASSEMBLY AND SYSTEM FOR ENHANCING EMI SHIELDING

BACKGROUND OF THE INVENTION

The present invention relates generally to an apparatus, assembly, and system for providing shielding against electromagnetic interference (EMI). In particular, the invention relates to an improved apparatus, assembly, and system that are particularly adapted for shielding a circuit card in an electronic enclosure against the negative consequences of EMI by expeditiously complying with industry accepted standards.

Electromagnetic compatibility (EMC) means that electric and electronic devices are compatible with similar devices in their vicinity in terms of shielding against EMI caused by the electromagnetic (EM) energy levels so that EMI does not adversely affect their operations. Because of the faster and more powerful computer systems evolving, EMI levels associated therewith are consequently changing and becoming relatively more difficult to satisfy. Manufacturers seek to achieve EMC to avoid malfunctioning of their systems and for gaining product acceptance. Towards this end, standards and requirements governing EMI have been and are becoming very common since they represent a way of insuring proper operation of electronic equipment. Manufacturers generally desire these standards since they tend to ensure that electronic devices do not interfere with their own operation or the operation of nearby electronic equipment. Furthermore, trade is facilitated by, for example, overcoming technical barriers to products.

Many electronic devices, such as computers, are made from a plurality of various electronic components, such as printed circuit boards. The printed circuit boards are typically electrically and mechanically connected to a backplane that is located within the housing. For example, peripheral component interface (PCI) circuit boards or cards are often used to connect computer peripheral devices to, for example, a computer motherboard. In the evolving computer field there is a continuing trend for size reduction of components and increases in their operating capabilities. Moreover, as the capabilities of the electronic devices have increased, the number of electronic components, such as PCI boards, required to be located within a computer has also generally increased. The reduced sizes of the electronic devices coupled with the increased number of electronic components located within the electronic devices has increased the need for improved EMI shielding. The improved shielding requirements present even more problems with PCI boards since the latter generally interface to external peripheral components and accordingly are associated with openings in the electronic housing. These openings are generally detrimental to the EMI requirements of the electronic devices.

One known approach for dealing with EMI issues in the context of a computer system using PCI cards is to employ the open industry PCI standards established by and available from the PCI-Special Interest Group (PCI-SIG). The standards available from this group cover several aspects of the PCI cards. For addressing some of these standards, it is well known in the field to use tailstock assemblies that form part of a PCI card assembly and function as an EMI barrier. The tailstock are electrically conductive and act to reduce these EMI issues adjacent the end of the cards that are typically adjacent openings in a computer's chassis. The tailstocks not only provide desired EMI shielding characteristics, but enhance overall card rigidity, as well as a serve as a convenient installing mechanism. A typical PCI card tailstock includes a unitary bracket comprised of an elongated, flat metallic stamped element that is secured, as by appropriate fasteners, to a card end. Tailstocks are provided with spaced apertures allowing for passage and coupling of electrical connectors to the PCI card as well as for controlling EMI emissions.

However, in order to comply with relatively more recent and more rigorous specifications specified in relevant standards for PCI cards (e.g., PCI Local Bus specification version 2.2), it is now recommended that the tailstock be attached to a bottom surface of the card as opposed to the previously recommended top card surface. A reason for the change is that it forces repositioning of the attaching tab to the PCI card, whereby a tailstock notch or opening formed adjacent the tab bend that provides EMI exposure is better shielded. While the tab relocation technique provides an enhanced EMI barrier or shield at this area, there are nevertheless some potential negative tradeoffs when implemented. For example, the relocated tab creates potential tolerance issues for the fastener used for joining the card to the tailstock. In particular, relocation makes it relatively more difficult to retain threaded fasteners within a PCI specification's bottom or backside form factor. This form factor is intended to restrict board components from exceeding it so as to thereby minimize potential costly physical damage to surrounding components in an electronic enclosure. Moreover, in order to comply with this newer specification, a manufacturer would have to use shorter and relatively more costly specially constructed threaded fasteners. However, the use of shorter and specially constructed fasteners would lead to additional potential problems in that the strength of the threaded attachment is diminished due to fewer engaged threads being employed, thereby compromising the overall structural integrity of the PCI cards as well as being relatively more expensive than conventionally used or so-called off-the-shelf fasteners. It will be appreciated, therefore, that without the ability to provide for effective and reliable EMI shielding for electronic devices, such a PCI cards, in a computer system, especially in the context of satisfying industry accepted standards, the true potential of providing reliable EMI shielding is less than otherwise desired. Accordingly, it would be highly desirable to provide for effective EMC integrity in such systems by providing EMI shielding for such cards which satisfy certain industry accepted standards, whereby such cards can be used in multiple brands of computer systems.

SUMMARY OF THE INVENTION

An aspect of the present invention is to provide an apparatus for providing EMC integrity through the provision of EMI shielding of a circuit card.

An aspect of the present invention is to provide an apparatus for enhancing EMC integrity by providing EMI shielding of a PCI card so as to expeditiously comply with industry standards governing EMI.

An aspect of the present invention is to provide an improved circuit card assembly of the type noted for use in an electronic system that effectively provides EMC integrity for the card assembly and system.

Still another aspect of the present invention is to provide an improved PCI card assembly for use in a computer system that effectively provides EMI shielding integrity for the PCI card assembly and system but, in addition, complies with industry accepted standards controlling PCI devices relative to EMI.

Still another aspect of the present invention is to provide an apparatus, assembly and system for providing EMI shielding that complies with industry standards in a low-cost and reliable manner.

In this regard, the present invention provides an apparatus comprising: a body providing EMI shielding and including an attaching portion extending therefrom, the attaching portion has a segment at a proximal end portion thereof which blocks an opening in the body for controlling EMI leakage and positions the attaching portion so that a fastener can fasten the attaching portion to a circuit card such that a first fastener end is engageable in juxtaposed relationship with a first card surface and a second fastener end terminates so as not to extend generally beyond a predetermined distance from a second card surface of the card.

In an illustrated embodiment, the circuit card is a PCI card and the predetermined distance is defined as a form factor dimension established by a PCI specification. In another illustrated embodiment, the proximal end segment is a folded portion that provides a hem which positions the attaching portion relative to the card without compromising EMI blocking of the opening by the proximal end segment.

A tailstock assembly or apparatus comprises an elongated body portion providing EMI shielding and includes an attaching portion extending laterally therefrom. The attaching portion has a segment at a proximal end portion thereof which blocks an opening in a bracket portion for controlling EMI and positions the attaching portion so that a fastener can fasten the attaching portion to the PCI card such that a first fastener end is engageable in juxtaposed relationship with a datum surface of a PCI card surface and a second fastener end terminates so as not to extend generally beyond a predetermined distance from the PCI card surface opposite the datum surface.

The present invention also includes a circuit card assembly for use in providing EMI shielding for a circuit card, the circuit card assembly comprising: a circuit card; a fastener; and, a shielding apparatus. The shielding apparatus comprises: a body providing EMI shielding and including an attaching portion extending therefrom. The attaching portion has a segment at a proximal end portion thereof which blocks an opening in the body for controlling EMI leakage and positions the attaching portion so that a fastener can fasten the attaching portion to a circuit card such that a first fastener end is engageable in juxtaposed relationship with a first card surface and a second fastener end terminates so as not to extend generally beyond a predetermined distance from a second card surface of the card.

Still another preferred embodiment is directed to a computer system comprising an enclosure, circuit card assembly, and a mounting structure for the circuit card assembly of the type noted above.

BRIEF DESCRIPTION OF THE DRAWINGS

For a more complete understanding of the present invention, reference is now made to the following detailed description of a preferred embodiment of the present invention illustrated in the accompanying drawings in which:

FIG. 1 is a perspective view of an interior portion of a computer system embodying one preferred embodiment of the present invention illustrating a PCI card assembly being attached to an EMC supporting structure therefor.

FIG. 2 is a fragmentary elevation view illustrating a PCI card assembly in accordance with a preferred embodiment of the present invention.

FIG. 3 is an end view of the PCI card assembly of FIG. 2.

FIG. 4 is a fragmentary planar view of the PCI card assembly illustrated in FIG. 2.

FIG. 5 is an enlarged fragmentary view illustrating a portion of a tailstock assembly and a PCI card.

DETAILED DESCRIPTION

Figure 6:
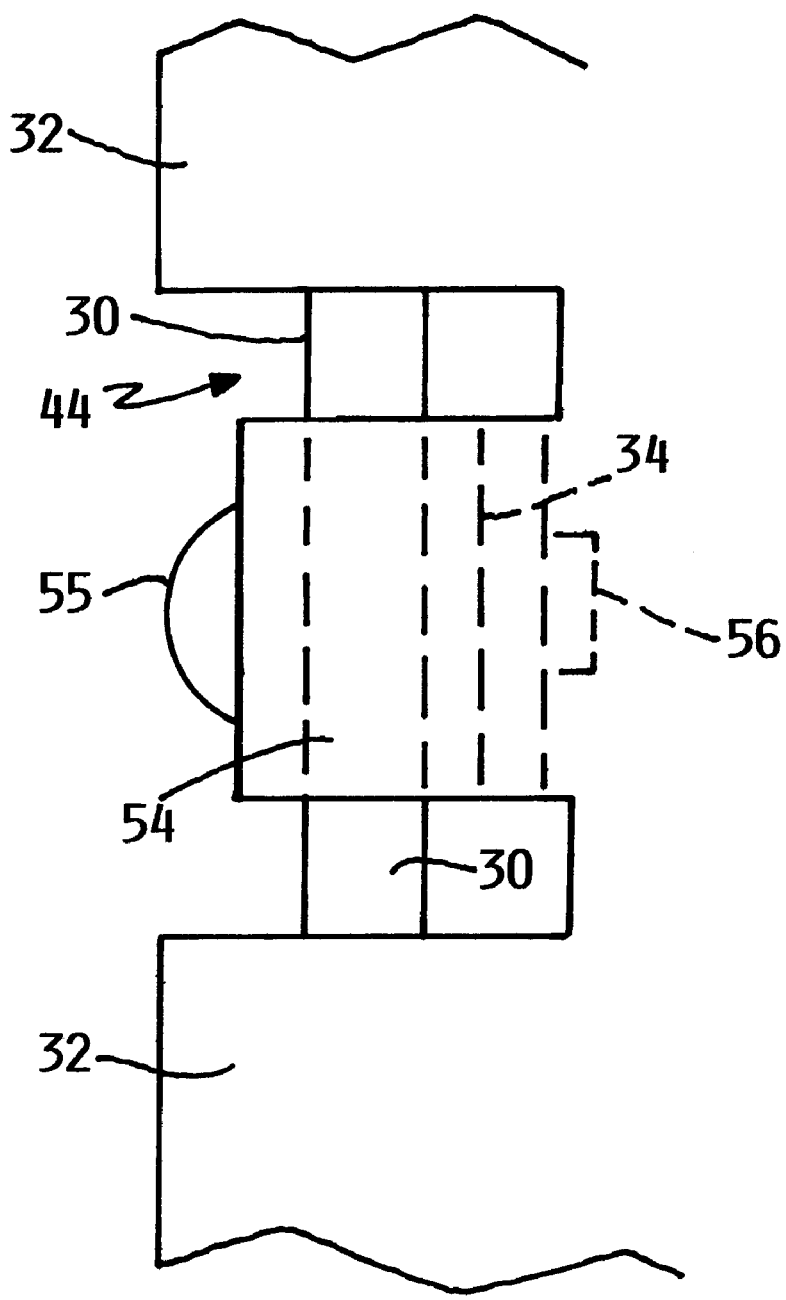
FIG. 6 is an enlarged fragmentary view illustrating an attaching portion of the tailstock in relationship with an opening in the tailstock.

Reference is made initially to FIGS. 1–6 for illustrating one preferred embodiment of a computer system 10 including an electronic enclosure or housing assembly 12 for enclosing a plurality of printed circuit boards or cards, such as peripheral component interface (PCI) card assemblies 14; only one of which is depicted. The PCI card assembly 14 is directed to providing EMI shielding by attenuating EMI between the interior and exterior of the housing assembly as well as attenuating EMI to the PCI card assembly itself so as to comply with certain industry accepted PCI specifications; such as PCI Local Bus specification (version 2.2). The computer system 10 may be implemented utilizing a computer, such as IBM iSeries®, a product of International Business Machines Corporation, Armonk, N.Y. It will also be appreciated that the principles of the invention apply to such kinds of cards not only in a computer system, but also other electronic devices or systems providing EMI shielding. The housing assembly 12 includes a known cover or casing 16 exterior of a faceplate 18. The faceplate 18 is affixed to a chassis (not shown). The faceplate 18 defines a plurality of spaced apart PCI slots 20. Each of the slots 20 is adapted to slidably receive in a known manner a respective PCI card assembly 14. It will be appreciated that the slots 20 are exposed to the exterior of the casing 16 for allowing cables and/or connectors (not shown) to pass therethrough to the PCI card assembly 14 mounted interiorly of the housing assembly. The faceplate 18 is provided with EMC gaskets 22 in a known manner. Such a faceplate serves as an EMC shielding member. While the preferred embodiment is in the context of a computer system, it will be appreciated that the principles of the present invention apply to other electronic systems enclosing PCI cards or the like.

FIGS. 2–6 illustrate one preferred embodiment of a PCI card assembly 14 which includes a conventional kind of circuit board or card 30 that has attached at each longitudinal end thereof an internal shield apparatus 32 for providing EMI shielding at the PCI slots. In this preferred embodiment, the shielding apparatus is defined by a tailstock apparatus or assembly 32 (only one of which is shown). The tailstock assembly 32 includes a pair of laterally extending and spaced bent or folded attaching portions or tabs 34 that are fastened to the printed circuit card 30 as by fasteners 36 and are bent generally perpendicularly relative to the plane of the longitudinal extent of the tailstock as illustrated. The fasteners 36 are threaded, such as screws or the like, but can include rivets or other similar fastening elements. In a preferred embodiment, the threaded fastener 36 is a screw having the following specifications 4–40 thread, 6–12 mm long. The tailstock assemblies 32 serve to mount and easily install the PCI card assemblies 14 to an EMC faceplate 18 that is mounted interiorly of the housing, whereby the card assemblies are positioned in juxtaposed relationship with an opening (not shown) in the casing 16 for reducing EMI and for allowing the connectors and/or wiring to be joined to the computer system.

Each of the tailstock assemblies 32 includes ideally an elongated body or bracket portion 40 made of, for example, a generally flat metal stamping, such as of steel having a plurality of openings 42a, b for allowing the connectors and/or other wiring to pass therethrough in a known manner. The bracket portion 40, as is known, is electrically connected to the housing assembly at a plurality of locations to reduce EMI. Although steel is described as an electrically conductive material for providing the EMI, other materials are contemplated. Moreover, the tailstock assembly 32 need not have the size and shape as illustrated in this embodiment, but can also have a wide variety of shapes and sizes so long as they are consistent with the functioning as described herein. In addition, instead of the bracket being a single structure, it can be made of several integrated components. It will be appreciated, therefore, that the term tailstock as used herein is not limited to a tailstock as illustrated and described, but includes other structures.

FIGS. 2–6 depict the attaching portions 34 being bent or folded generally perpendicularly from a plane of the bracket portion 40 in a region or opening 44. As shown in FIG. 6, the opening 44 is a cutout area or notch that allows the attaching portion 34 to be bent as noted. As noted earlier, the PCI Local Bus specification (version 2.2), suggests that the bent attaching portion 34 be attached to a first or bottom surface 46 of the card 30; as opposed to the opposing top or datum surface 48. However, the present invention provides for the attaching portion 34 having a proximal end portion 50 with a folded segment 52 or hem 52 that serves to allow repositioning of the attaching portion 34. The proximal end portion 50 has a planar segment 54 extending outwardly into the plane of the opening 44 by a distance that restricts the size of such opening to thereby comply with the noted PCI specification. It will be appreciated that the folded hem portion 52 repositions the attaching portion 34, whereby it can engage the datum or top surface 48. As a result, the threaded fastener 36 can have its head portion 55 directly engaging the circuit board 30. Moreover, a terminal end portion 56 of the fastener is threaded through apertures 58a, b in the card and the attaching portion. In this embodiment, the threaded fastener 36 has a length in a range of about 6 to about 12 mm. Such fasteners are common and provide adequate strength between the card and the attaching portion. In addition, the fastener head portion 55 remains within the maximum PCI height form factor specification for the backside is generally indicated by a distance or height "A"; which according to this embodiment is 2.67 mm (FIG. 4) as measured from the bottom planar bottom surface 46. As a result, not only is the PCI height specification complied with because the threaded member does not extend beyond it, but also the folded segment effectively reduces the size of opening 44 by approximately the same amount as would be the case if the tab were attached to the bottom surface; thereby providing the desired EMI shielding complying with the noted PCI specification. Another advantage of the foregoing arrangement is that a threaded fastener can be used which does not have to be especially made shorter then those currently used (e.g., 6.4 mm) with current PCI card assemblies.

As noted earlier, this is important because a threaded fastener shorter than that currently used poses a problem in that the threaded connection between the card and the attaching portion might be less than otherwise thought desirable thereby resulting in a weakened connection between the components that might be relatively more prone to failure. Furthermore, by having the fastener remain within the backside form factor height specification there is less of a tendency for a fastener damaging other juxtaposed components in the computer system. The present invention, envisions that the folded portion need not be folded as illustrated but can have other configurations as well so long as the opening 44 is reduced by approximately the same amount as would be the case if the attaching portion were connected directly to the bottom surface as suggested by the new PCI Local Bus specification (version 2.2) and the threaded member does not extend beyond the noted backside form factor height specification. Advantageously, a relatively less expensive and relatively more robust threaded connection may be maintained without the necessity to resort to shorter screws resulting in tolerance, thread engagement, and assembly concerns that could also lessen the integrity of the threaded connection.

The embodiments and examples set forth herein were presented to best explain the present invention and its practical application and to thereby enable those skilled in the art to make and use the invention. However, those skilled in the art will recognize that the foregoing description and examples have been presented for purposes of illustration and example only. The description set forth is not intended to be exhaustive or to limit the invention to the precise forms disclosed. Many modifications and variations are possible in light of the above teachings without departing from the spirit and scope of the appended claims.

What is claimed is:

1. An apparatus for providing EMI shielding comprising: a body providing EMI shielding and including an attaching portion extending therefrom, the attaching portion has a proximal end portion with a folded segment, the proximal end portion has a planar segment extending in an opening in the body, wherein the folded segment positions the attaching portion so that a fastener can fasten the attaching portion directly to a circuit card such that a fastener head portion is directly engageable with a first card surface, whereby a fastener head portion would not extend generally beyond a predetermined distance from the first card surface.

2. The apparatus of claim 1 wherein the folded segment is folded on itself as a hem.

3. The apparatus of claim 1 wherein the predetermined distance is defined as a backside form factor dimension of about 2.67 mm.

4. The apparatus of claim 1 wherein the body includes an elongated bracket portion that is to extend along an end portion of a circuit card.

5. A tailstock apparatus comprising: a bracket portion providing for EMI shielding and including an attaching portion extending laterally therefrom, the attaching portion has a proximal end portion with a folded segment, the proximal end portion having a planar segment extending in an opening in the bracket portion for controlling EMI and positions the attaching portion so that a fastener can fasten the attaching portion to a PCI card such that a fastener head portion is directly engageable in juxtaposed relationship with a first PCI card surface so that the head portion does not extend generally beyond a predetermined distance from a first PCI card surface.

6. The tailstock apparatus of claim 5, wherein the folded segment is folded on itself as a hem.

7. The tailstock apparatus of claim 5, wherein the predetermined distance is defined as a backside form factor dimension established by a PCI Local Bus specification (version 2.2).

8. The tailstock apparatus of claim 5 wherein the bracket portion is elongated to extend along an end portion of the card and is made of a material for reducing EMI emissions.

9. An assembly for use in providing EMI shielding for a circuit card, the assembly comprising: a circuit card; a fastener; and, a shielding apparatus comprising: a body providing EMI shielding and including an attaching portion extending therefrom, the attaching portion has a proximal end portion with a folded segment, the proximal end portion having a planar segment extending in an opening in the body for controlling EMI leakage and positions the attaching portion so that the fastener can fasten the attaching portion to the circuit card such that a fastener head portion of the fastener is directly engaged in juxtaposed relationship with a first card surface so that the head portion does not extend generally beyond a predetermined distance from the first card surface.

10. An assembly for use in providing EMI shielding for a PCI card, the assembly comprising: a PCI card; a fastener; and, a shielding apparatus attached to the PCI card by the fastener; the apparatus comprising a body providing EMI shielding and including an attaching portion extending therefrom, the attaching portion has a proximal end portion with a folded segment, the proximal end portion has a planar segment extending in an opening in the body for controlling EMI leakage and positions, the folded segment positions the attaching portion so that the fastener fastens the attaching portion to the PCI card such that a head portion of the fastener is directly engaged with a first PCI card surface so that the head portion does not extend generally beyond a predetermined distance from the first PCI card surface.

11. The assembly of claim 10 wherein the folded segment is folded on itself as a hem.

12. The assembly of claim 10 wherein the predetermined distance is defined as a backside form factor dimension established by a PCI Local Bus specification (version 2.2).

13. The assembly of claim 10 wherein the body includes an elongated bracket portion that is to extend along an end portion of a circuit card and includes at least one aperture for allowing a connector and/or wiring to pass therethrough.

14. An electronic enclosure providing for EMI shielding, the enclosure comprising:

a housing assembly including an opening for allowing passage of a connector and/or wiring, and a shield member adapted to position and mount a circuit card adjacent the opening; wherein the shield member is an EMC shield member positioned within the enclosure adjacent the opening and constructed so as to retain an end portion of a circuit card assembly therein; and an assembly for use in providing EMI shielding for a circuit card, the assembly comprising: a circuit card; a fastener; and a shielding apparatus attached to the circuit card by the fastener; the apparatus comprising a body providing EMI shielding and including an attaching portion extending therefrom, the attaching portion has a proximal end portion with a folded segment, the proximal end portion has a planar segment extending in an opening in the body and the folded segment positions the attaching portion so that the fastener fastens the attaching portion to a circuit card such that a fastener head portion directly engages a card surface so that the head portion does not extend generally beyond a predetermined distance from the card surface.

15. A computer system comprising:

an electronic enclosure providing for EMI shielding, the enclosure comprising:

a housing assembly including an opening for allowing passage of cables and/or connectors, and a shield member adapted to position and mount a circuit card adjacent the opening; wherein the shield member is an EMC shield member positioned within the enclosure adjacent the opening and constructed so as to retain an end portion of a PCI card assembly therein; and an assembly for use in providing EMI shielding for a PCI card, the assembly comprising: a PCI card; a fastener; and, a shielding apparatus attached to the PCI card by the fastener; the apparatus comprising a body providing EMI shielding and including an attaching portion extending therefrom, the attaching portion has a proximal end portion, the proximal end portion has a planar segment extending in an opening in the body for controlling EMI leakage, the proximal end portion has a folded segment which positions the attaching portion so that the fastener fastens the attaching portion to the PCI card such that a fastener head portion is directly engaged in juxtaposed relationship with a card surface so as not to extend generally beyond a predetermined distance from the card surface.

* * * * *